(12) United States Patent
Motwani et al.

(10) Patent No.: US 9,037,943 B2
(45) Date of Patent: May 19, 2015

(54) IDENTIFICATION OF NON-VOLATILE MEMORY DIE FOR USE IN REMEDIAL ACTION

(71) Applicant: INTEL CORPORATION, Santa Clara, CA (US)

(72) Inventors: Ravi H. Motwani, San Diego, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 13/662,160

(22) Filed: Oct. 26, 2012

(65) Prior Publication Data
US 2014/0122963 A1    May 1, 2014

(51) Int. Cl.
*H03M 13/00* (2006.01)
*H03M 13/29* (2006.01)
*H03M 13/09* (2006.01)
*H03M 13/11* (2006.01)

(52) U.S. Cl.
CPC .......... *H03M 13/2927* (2013.01); *H03M 13/09* (2013.01); *H03M 13/1102* (2013.01); *H03M 13/293* (2013.01); *H03M 13/2948* (2013.01); *H03M 13/2957* (2013.01)

(58) Field of Classification Search
CPC .. H03M 13/09; H03M 13/091; H04L 1/0061; H04L 1/0057; H04L 1/0045; G06F 2211/1028; G06F 11/1044; G06F 11/1072; G06F 2211/109; G06F 3/0688; G06F 11/0793
See application file for complete search history.

(56) References Cited

U.S. PATENT DOCUMENTS

| | | | |
|---|---|---|---|
| 5,291,498 A * | 3/1994 | Jackson et al. ................ 714/758 |
| 5,428,630 A * | 6/1995 | Weng et al. .................... 714/763 |
| 7,043,673 B1 * | 5/2006 | Ichiriu et al. .................. 714/719 |
| 7,409,586 B1 * | 8/2008 | Bezbaruah et al. ............ 714/13 |
| 2006/0277434 A1 * | 12/2006 | Tsern et al. .................... 714/17 |
| 2008/0065933 A1 * | 3/2008 | Thayer ............................ 714/42 |
| 2010/0122148 A1 * | 5/2010 | Flynn et al. ................... 714/773 |
| 2011/0167319 A1 * | 7/2011 | Jeddeloh ........................ 714/763 |
| 2011/0239084 A1 * | 9/2011 | Abbasfar ....................... 714/758 |
| 2013/0151767 A1 * | 6/2013 | Berke et al. ................... 711/105 |
| 2014/0089760 A1 * | 3/2014 | Schmidt et al. ............... 714/766 |

* cited by examiner

*Primary Examiner* — Albert Decady
*Assistant Examiner* — Enamul M Kabir
(74) *Attorney, Agent, or Firm* — Schwabe, Williamson & Wyatt, P.C.

(57) ABSTRACT

Embodiments of apparatus, methods, storage drives, computer-readable media, systems and devices are described herein for identification of die of non-volatile memory for use in remedial action. In various embodiments, a first block may be configured to encode data to be stored in a non-volatile memory as a codeword. In various embodiments, the first block may be configured to store respective portions of the codeword in a distributed manner across a plurality of die of the non-volatile memory. In various embodiments, the first block may be configured to generate respective error detection codes for the plurality of die.

23 Claims, 5 Drawing Sheets

IDENTIFICATION OF NON-VOLATILE MEMORY DIE FOR USE IN REMEDIAL ACTION

FIELD

Embodiments of the present invention relate generally to the technical field of data processing, and more particularly, to identification of die of non-volatile memory for use in remedial action.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Data may be persistently stored on non-volatile memory. Error correction codes ("ECC") may be used to protect the stored data from raw bit errors ("RBER"). For example, original data may be encoded into a codeword, which may include the original data and parity data. In some cases, resilience to RBER increases with the size of the codeword. However, even when ECCs are used, decoding may still fail. When decoding fails, remedial action may be taken to attempt to recover the original data.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the terms "block," "module" and/or "logic" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
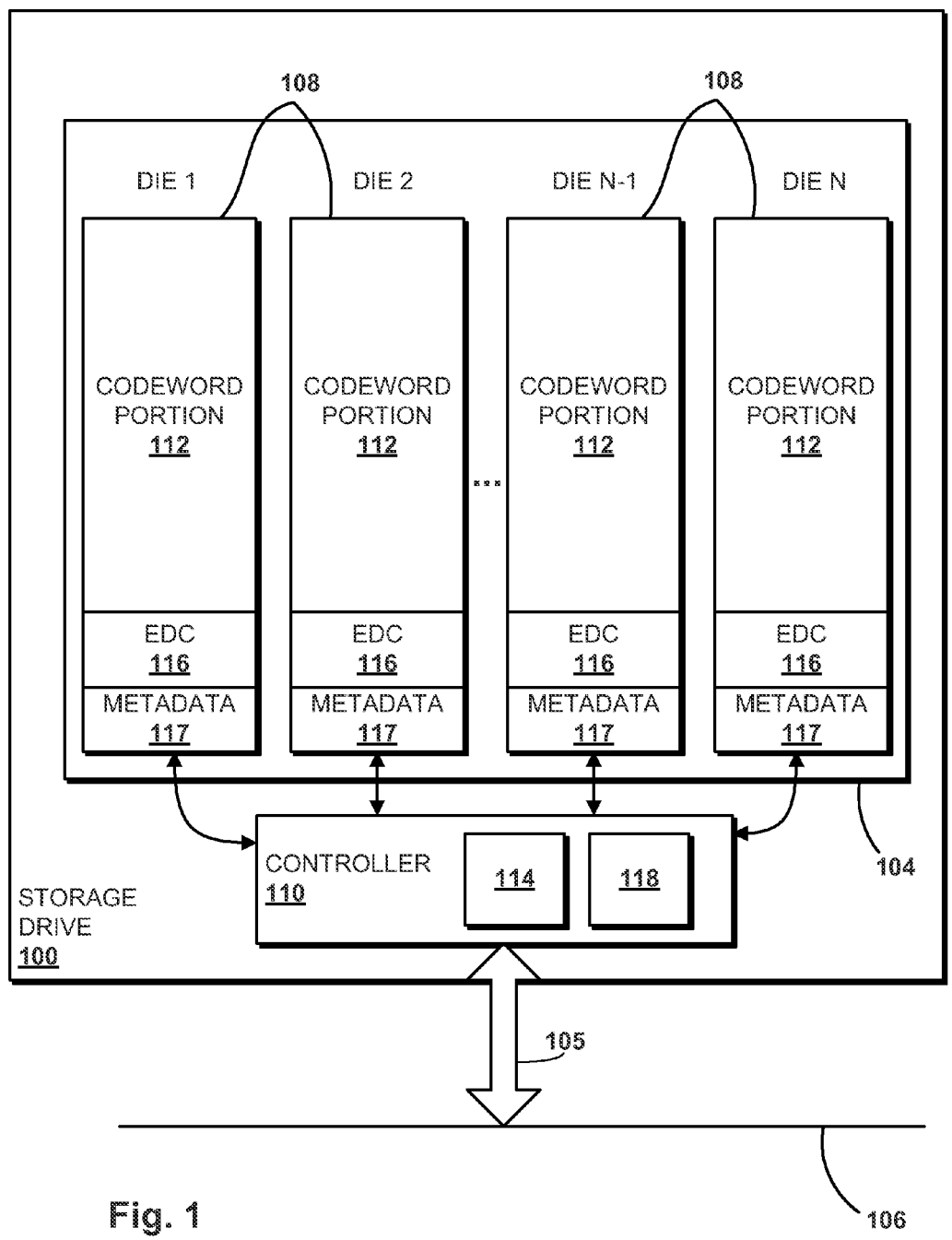
FIG. 1 schematically illustrates an example storage drive configured with application portions of the present disclosure, in accordance with various embodiments.

With reference to FIG. 1, in various embodiments, a storage drive 100 may include non-volatile memory 104. Data may be written to and/or read from non-volatile memory 104 by a controller 110, e.g., by way of an interface 105 to one or more communication lines 106. In various embodiments, interface 105 and/or communication lines 106 may come in various forms, including but not limited to Serial ATA ("SATA"), Peripheral Component Interconnect Express ("PCIe"), and so forth. Although not depicted, various other components may be coupled with storage drive 100 via one or more communication lines 106, including but not limited to one or more central processing units ("CPUs"), volatile memory (e.g., dynamic random access memory, or "DRAM"), one or more input/output ("I/O") devices, alternative processing units (e.g., graphics processors), and so forth. In various embodiments, storage drive 100 may be a solid state drive ("SSD") or hybrid hard drive ("HHD").

Non-volatile memory 104 may come in various forms, including but not limited to NAND (flash) memory, ferroelectric random-access memory ("FeTRAM"), nanowire-based non-volatile memory, phase change memory ("PCM"), PCM with switch ("PCMS"), memory that incorporates memristor technology, magnetoresistive random-access memory ("MRAM"), spin transfer torque MRAM ("STT-MRAM"), and so forth. In many cases, including the example of FIG. 1, non-volatile memory 104 may include a plurality of die 108. For example, in FIG. 1, non-volatile memory 104 includes N die 108. N may be any positive integer.

In various embodiments, error correcting codes may be used with original data stored in non-volatile memory 104 to protect the original data from raw bit errors ("RBER"). For example, the data may be encoded, e.g., by controller 110, into a "codeword." Various encoding schemes may be employed. For example, in various embodiments, concatenated coding, turbo coding, and/or low density parity checking ("LDPC") coding may be employed. In various embodiments, controller 110 may be any combination of hardware and software, and may be separate from storage drive 100, e.g., as an independent component, e.g., on a printed circuit board ("PCB," not shown).

In various embodiments, a codeword may include the original data plus parity data appended to the end. However, the form of the codeword is not material, and in other embodiments, codewords may take other forms. In general, the larger the codeword, the higher resilience non-volatile memory 104 may have to RBER. Accordingly, in various embodiments, particularly those in which volatile memory is PCM, controller 110 may be configured to store respective portions 112 of the codeword in a distributed manner across plurality of die 108. In some embodiments, a first block 114 (e.g., a control block) of controller 110 may be configured to perform these operations.

In various embodiments, controller 110, and in some cases first block 114, may be configured to decode the codeword, e.g., after the codeword is read from non-volatile memory 104. Various types of decoding schemes (complementary to the manner the codewords are encoded) may be employed by controller 110 and/or first block 114, including but not limited to iterative decoding schemes such as LDPC, concatenated schemes, turbo codes, and so forth. Many such decoding schemes may be capable of detecting and correcting at least some errors. However, if there are too many errors in the data read from plurality of die 108, an attempt to decode the codeword may fail.

In the event of a failed attempt, e.g., by first block 114, to decode the codeword, one or more remedial actions may be taken. For example, in various embodiments, a codeword portion 112 stored on a die 108 having, e.g., the highest RBER, may be reconstructed, e.g., using an XOR die (not shown) associated with plurality of die 108. The decoding may then be attempted again with the reconstructed codeword portion 112. As another example, controller 110 may attempt to decode the codeword in a manner different than the failed attempt. For instance, controller 110 may designate bits of the codeword portion 112 stored on the die 108 having the highest RBER as "erasures," and then employ Reed-Solomon decoding to attempt to decode the codeword again. As another example, the codeword may be re-read, e.g., by controller 110, from a different demarcation point to counter systematic effects like retention or drift. In various embodiments, one, two, or all three of these remedial actions may be attempted, alone or in combination with each other or with other remedial actions.

One thing each of these remedial actions has in common is identification of a suitable die 108 (e.g., a most "problematic" die 108) for use in remedial action. The die 108 suitable for use in remedial action may be defined in various ways. In some embodiments, it may be the die 108 having the highest RBER. In other embodiments, such as examples described below, it may be a die 108 satisfying other similar or different criteria.

However the most suitable die 108 for use in remedial action is defined, identifying it through an exhaustive search may not be efficient. An exhaustive search may include choosing any die randomly for use in remedial action such as a decoding retry. If the decoding retry fails, another die may be chosen (e.g., at random or in a round-robin manner) and decoding may be tried again. This may continue until a successful decode, or until all die have been identified as failures, in which case recovery may be abandoned. The latency resulting from such an exhaustive search may prove an impediment to meeting a desired quality of service ("QpS").

Accordingly, in various embodiments, controller 110, and in some cases, a first block 114, may be configured to generate respective error detection codes 116 for plurality of die 108. These error detection codes may facilitate efficient identification of a suitable die 108 for remedial action. For example, an error detection code 116 for a particular die 108 may be generated from the codeword portion 112 stored on that die 108. Using error detection codes 116, controller 110, and in some cases, a second, error correction block 118 of controller 110, may be configured to identify a first die 108 of plurality of die 108 for use in performance of one or more of the remedial actions described above. Each die 108 may also store metadata 117, which may include various types of information. In various embodiments, metadata 117 may be used to encode data and/or to produce error detection code 116. For example, in various embodiments, metadata 117 may be encoded with the original data and/or a cyclic redundancy check ("CRC") to generate a codeword.

Figure 2:
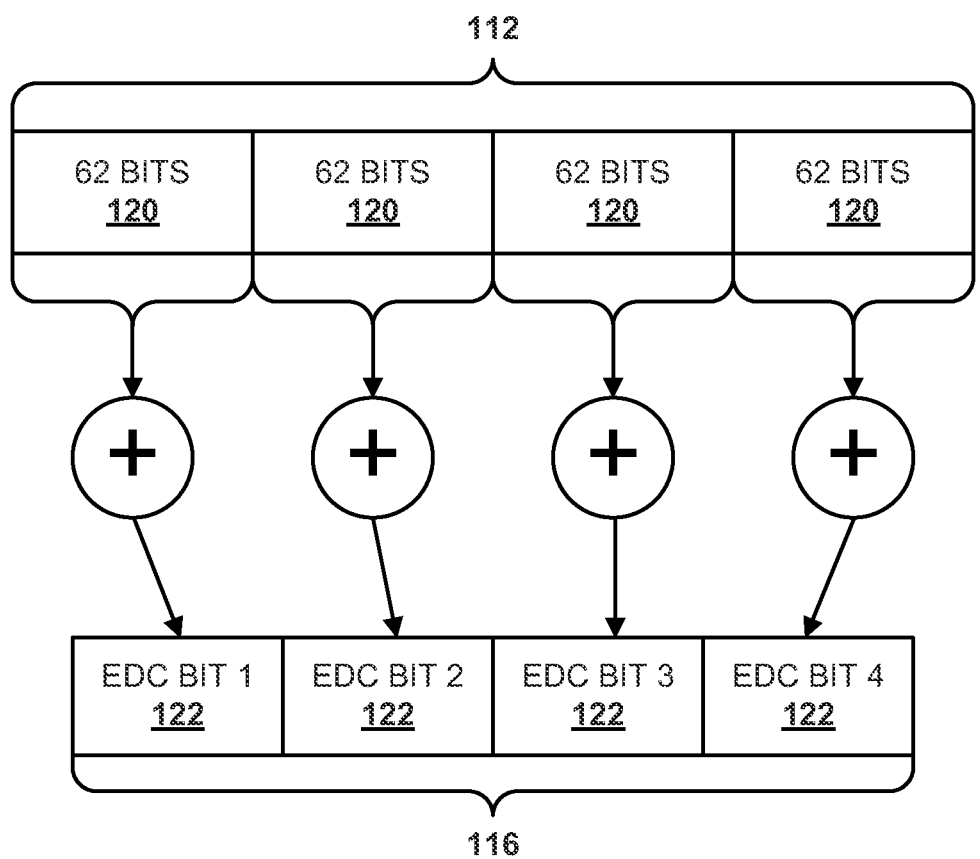
FIG. 2 depicts an example of how an error detection code may be generated from a codeword portion, in accordance with various embodiments.

Various types of error detection codes 116 may be employed. For example, and with reference to FIG. 2, a codeword portion 112 is shown logically divided into four sub-portions 120. Codeword portions 112 of a variety of sizes may be logically divided into any number of sub-portions of any size. For example, in some embodiments, codeword portion 112 may be logically divided into four 62-bit portions, as shown in FIG. 2.

In some embodiments, an error detection code 116 may include a plurality of parity bits 122 generated from the sub-portions 120. In various embodiments, the plurality of parity bits 122 may be calculated based on respective sub-portions of the codeword portion 112. For example, and as shown in FIG. 2, each of the plurality of parity bits 122 may be an XOR result of bits of the corresponding sub-portion 120 of codeword portion 112. In various embodiments, at the time the codeword is encoded and stored in a distributed manner across plurality of die (e.g., 108 in FIG. 1), plurality of parity bits 122 may be generated for each codeword portion 112 on each respective die 108. If errors later develop on the stored data, then the XOR results of the sub-portions 120 of each codeword portion 112 may no longer yield the parity bits 122 of the corresponding error detection code 116.

In various embodiments, controller 110, and in some cases second block 118, may use plurality of parity bits 122, which together form error detection code 116, to count sub-portions 120 of the corresponding codeword portion 112 that include an error. Second block 118 may determine counts of sub-portions 120 of each codeword portion 112 that have errors. Second block 118 may then identify the die 108 storing the codeword portion 112 having the highest count. This identified die may then be used for one or more of the remedial actions described above.

Figure 3:
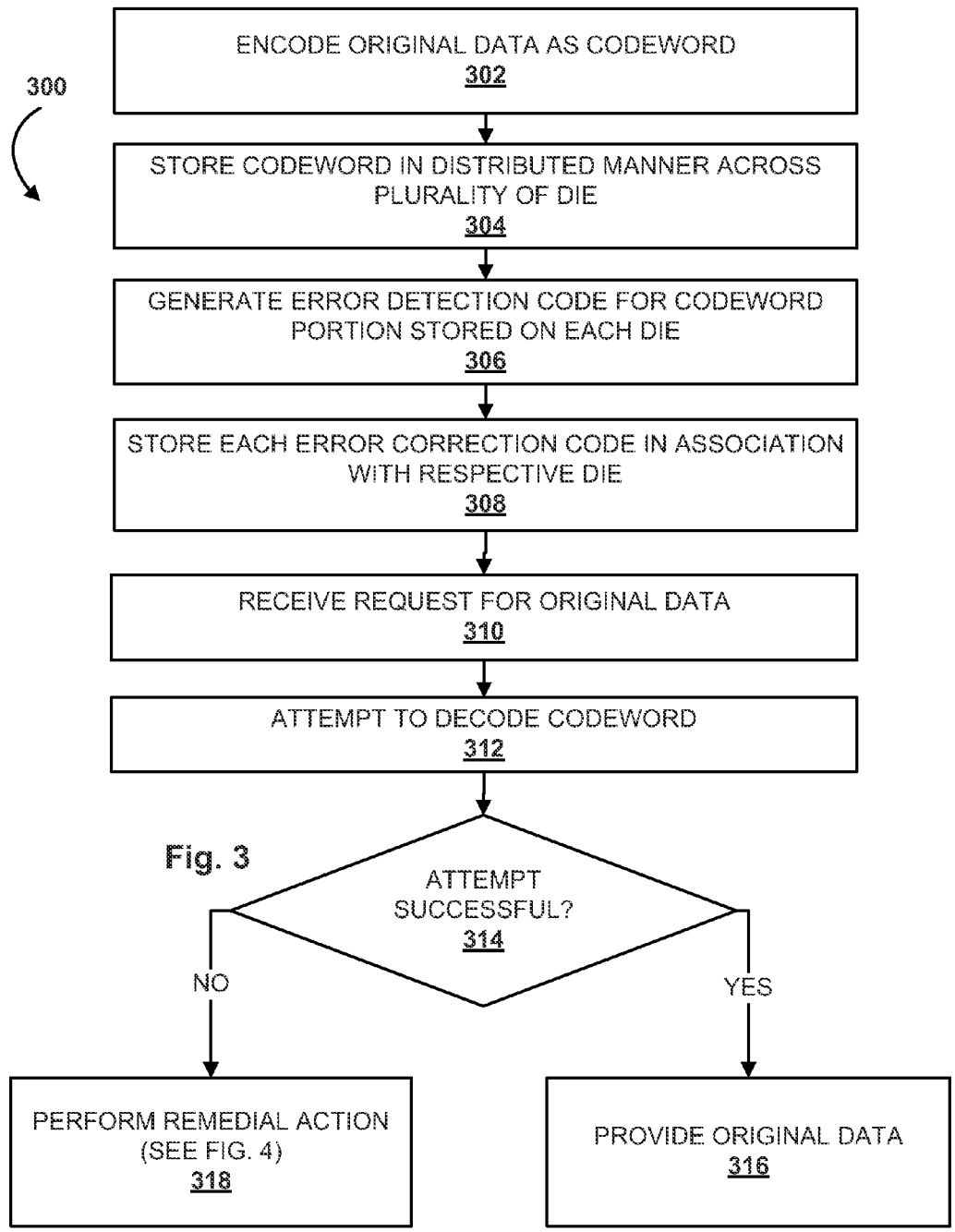
FIG. 3 depicts an example method that may be implemented by a controller configured with applicable portions of the present disclosure, in accordance with various embodiments.

FIG. 3 depicts an example method 300, applicable portions of which may be implemented by controller 110 and/or constituent portions of controller 110, such as first block 114 and/or second block 118. At block 302, original data to-be-written to non-volatile memory 104, may be encoded, e.g., by first block 114, as a codeword. For example, first block 114 may implement iterative encoding (e.g., LDPC) or other similar schemes.

At block 304, the codeword may be stored, e.g., by first block 114, in a distributed manner across plurality of die 108. For example, in some embodiments, 31-byte codeword portions 112 may be stored on each die. At block 306, an error detection code 116 may be generated, e.g., by first block 114 and/or second block 118, based on data read from each die 108, particularly the respective codeword portion 112. For example, a plurality of parity bits 122 my be generated from respective sub-portions 120 of each codeword portion 112. At block 308, the generated error detection codes 116 may be stored, e.g., by first block 114 or second block 118, in association with (e.g., on) the respective die 108.

At block 310, a request for the original data may be received, e.g., by controller 110 and/or first block 114. For example, an application program executing on a computing device in which storage drive 100 is employed may cause at least one processing unit to send a read request to controller 110.

At block 312, controller 110 and/or first block 114 may attempt to decode the codeword to obtain the original data. At block 314, if the decoding attempt is successful, then the original data may be provided to the requesting entity at block 316. However, if at block 314, the decoding attempt fails, then at block 318, controller 110 and/or second block 118 may take remedial action.

Figure 4:
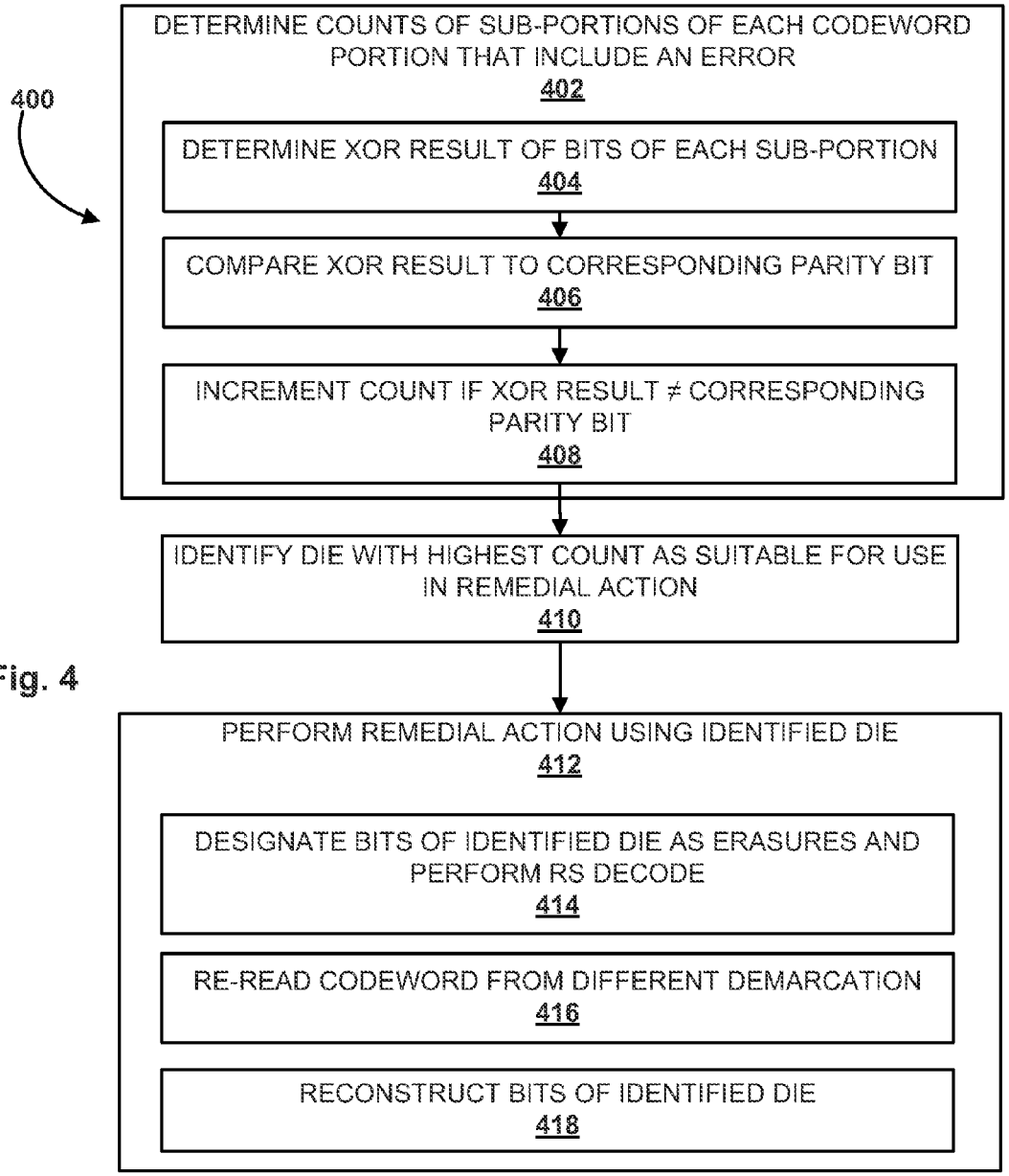
FIG. 4 depicts another example method that may be implemented by a controller configured with applicable portions of the present disclosure, in accordance with various embodiments.

FIG. 4 depicts example operations 400 that may be performed by controller 110 and/or its constituent components, such as second block 118, to perform the remedial action of block 318 in FIG. 3. At block 402, counts of sub-portions 120 of each codeword portion 112 that include an error may be determined, e.g., by second block 118. For example, at block 404, XOR results of bits of each sub-portion 120 may be determined. At block 406, the XOR results determined at block 404 may be compared to corresponding parity bits 122 of error detection code 116. At block 408, if an XOR result and the corresponding parity bit are not equal, that may indicate that the respective sub-portion 120 includes an error, and a count for the codeword portion 112 may be incremented, e.g., by second block 118.

At block 410, a die 108 having a highest count may be identified, e.g., by second block 118, as the die most suitable for use in remedial action. In other embodiments, the die most suitable for use in remedial action may be identified on other bases. For instance, the die 108 having the highest RBER, or the highest absolute number of errors (regardless of where those errors occur on the die) may be identified.

At block 412, remedial action may be taken, e.g., by second block 118, to recover the original data. This may be done in a variety of ways. For instance, at block 414, second block 118 may designate bits of the identified die as "erasures." Second block 118 may then perform Reed-Solomon ("RS" in FIG. 4) decoding, which may be capable of recovering data that includes various amounts of erasures.

As another example, at block 416, second block 118 or first block 114 may re-read the codeword from a different demarcation point, e.g., to attempt to compensate for system drift. For example, if the identified die 108 is DIE 1 in FIG. 1, then first block 114 may re-read the codeword starting at DIE 2, for a decode attempt.

As yet another example, at block 418, controller 110 or any of its constituent parts may attempt to reconstruct the codeword portion 112 stored on the identified die 108. For example, during encoding at block 302 or codeword storage at block 304, controller 110 may store XOR results of data on one or more of the plurality of die on another die (not shown), which may be designated as an "XOR" die. Using various techniques (e.g., iterative decoding), controller 110 may utilize data stored on this XOR die, alone or in combination with data read from other die 108 of the plurality of die that were not identified at block 410, to reconstruct the codeword portion 112 stored on the identified die 108.

The aforementioned schemes for identifying suitable die for remedial action may be more efficient than exhaustive searching. For example, in an exhaustive search, over time, the probability that any particular die of N die will be suitable for use in remedial action (e.g., have the highest RBER) may be uniform. Thus, the odds that a randomly selected die of the N die is the most suitable choice for remedial action is 1/N. Anywhere between 1 and N−1 die may be incorrectly selected first, also with a probably of 1/N. Thus, using the exhaustive search, an average of (N−1)/2 die selections may be made before properly identifying the most suitable die for use in remedial action.

In contrast, identifying the suitable die for remedial action using error detection codes as described herein may offer improved results. For example, assume a codeword portion stored on a particular die is 62 bits, and that the die has k errors after a failed decode attempt. Assume also that the other N−1 die have a uniform RBER of r, and the RBER of the particular die is 2r. Using a posteriori error probability, it may be possible to compute an error count number for both the most suitable die for use in remedial action and the other N−1 die. Let the probability that the most suitable die has an error count greater than error counts of the other N−1 die be p. Then the average number of die incorrectly selected as the most suitable die for remedial action may, in various embodiments, be characterized as follows:

$$\sum_{k=0}^{N-1} k p^k (1-p)^{N-1-k}$$

Figure 5:
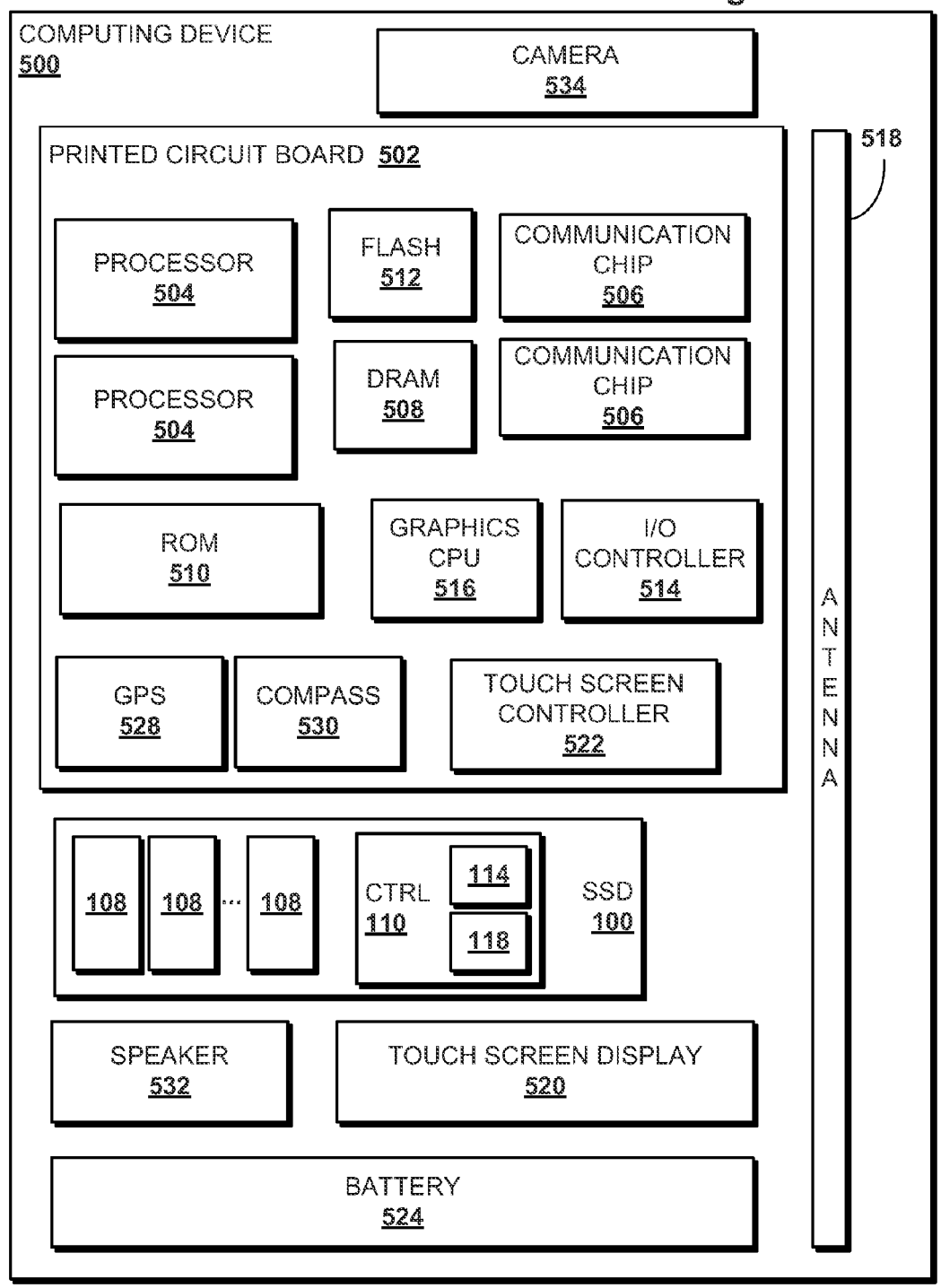
FIG. 5 depicts an example computing device that may be configured with applicable portions of the present disclosure, in accordance with various embodiments.

FIG. 5 illustrates an example computing device 500 in which devices such as storage drive 100 may be incorporated, in accordance with various embodiments. Computing device 500 may include a number of components, one or more processor(s) 504 and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include PCB 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, volatile memory (e.g., DRAM 508), non-volatile memory such as read only memory 510 ("ROM"), NAND (flash) memory 512, and storage drive 100 (which may include die 108, controller 110, first 114 and/or second (ECC) block 118 and other components described earlier and shown, for instance, in FIG. 1), an I/O controller 514, a digital signal processor (not shown), a crypto processor not shown), a graphics processor 516, One or more antenna 518, a display (not shown), a touch screen display 520, a touch screen controller 522, a battery 524, an audio codec (not shown), a video codec (not shown), a global positioning system ("GPS") device 528, a compass 530, an accelerometer (not shown), a gyroscope (not shown), a speaker 532, a camera 534, and a mass storage device (such as hard disk drive, a solid state drive, compact disk ("CD"), digital versatile disk ("DVD")) (not shown), and so forth. In various embodiments, the processor 504 may be integrated on the same die with other components to form a System on Chip ("SoC").

In various embodiments, and similar to storage drive 100, flash 512 may include a plurality of die (not shown). In various embodiments, the one or more processor(s) 504 and/or flash 512 may include associated firmware (not shown) storing programming instructions configured to enable computing device 500, in response to execution of the programming instructions by one or more processor(s) 504, to practice all or selected aspects of methods 300 or 400 using the die of flash 512. In various embodiments, these aspects may additionally or alternatively be implemented using hardware separate from the one or more processor(s) 504 or flash memory 512.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, General Packet Radio Service ("GPRS"), Evolution Data Optimized ("Ev-DO"), Evolved High Speed Packet Access ("HSPA+"), Evolved High Speed Downlink Packet Access ("HSDPA+"), Evolved High Speed Uplink Packet Access ("FISUPA+"), Global System for Mobile Communications ("GSM"), Enhanced Data rates for GSM Evolution ("EDGE"), Code Division Multiple Access ("CDMA"), Time Division Multiple Access ("TDMA"), Digital Enhanced Cordless Telecommunications ("DECT"), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LIE, Ev-DO, and others.

In various implementations, the computing device 500 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 500 may be any other electronic device that processes data.

Embodiments of apparatus, methods, computer-readable media (transitory and non-transitory), systems and devices are described herein for identification of die of non-volatile memory for use in remedial action. In various embodiments, a first block may be configured to encode data to be stored in a non-volatile memory as a codeword. In various embodiments, the first block may be configured to store respective portions of the codeword in a distributed manner across a plurality of die of the non-volatile memory. In various embodiments, the first block may be configured to generate respective error detection codes for the plurality of die.

In various embodiments, a second block may be coupled to the first block. In various embodiments, the second block may be configured to identify a first die of the plurality of die for use in remedial action, based at least in part on the error detection codes. in various embodiments, the second block may be configured to perform the identification in response to a failed attempt by the first block to decode the codeword.

In various embodiments, the first block and the second block may together comprise a memory controller. In various embodiments, the respective error detection codes may be stored on respective die.

In various embodiments, the remedial action may be an attempt to reconstruct a portion of the codeword read from the first die. In various embodiments, the remedial action may be another attempt to decode the codeword in a manner different than the failed attempt. In various embodiments, the another attempt to decode the codeword may include a designation of bits of the first die as erasures. In various embodiments, the another attempt to decode the codeword may include a re-read of the codeword from a different demarcation than was used in the failed attempt.

In various embodiments, the identification may include determination that more sub-portions of a first portion of the codeword stored on the first die include an error than sub-portions of a second portion of the codeword stored on a second die of the plurality of die. In various embodiments, the determination may include use of an error detection code generated from the first portion of the codeword. In various embodiments, the error detection code may be used to count sub-portions of the first portion of the codeword that include an error. In various embodiments, the error detection code may include a plurality of parity bits. In various embodiments, the plurality of parity bits may be calculated based on respective sub-portions of the first portion of the codeword. In various embodiments, the plurality of parity bits may be XOR results of bits of the respective sub-portions of the first portion.

In various embodiments, a controller may be configured to read, from a plurality of die of non-volatile memory, respective portions of a codeword stored in a distributed manner across the plurality of die. In various embodiments, the controller may identify, in response to a failed attempt to decode the codeword, a first die of the plurality of die, based at least in part on respective error detection codes associated with the plurality of die. In various embodiments, the controller may perform remedial action using the first die.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The invention claimed is:

1. An apparatus comprising:
a first block configured to encode data to be stored in a non-volatile memory as a codeword, to store respective portions of the codeword in a distributed manner across a plurality of die of the non-volatile memory, and to generate respective error detection codes for the plurality of die; and
a second block coupled to the first block and configured to identify a first die of the plurality of die for use in remedial action, based on a determination related to the error detection codes that more sub-portions of a first portion of the codeword stored on the first die include an error than sub-portions of a second portion of the codeword stored on a second die of the plurality of die.

2. The apparatus of claim 1, wherein the second block is configured to perform the identification in response to a failed attempt by the first block to decode the codeword.

3. The apparatus of claim 1, further comprising a memory controller, wherein the memory controller comprises the first and second blocks.

4. The apparatus of claim 1, wherein the remedial action comprises an attempt to reconstruct a portion of the codeword read from the first die.

5. The apparatus of claim 1, wherein the remedial action comprises another attempt to decode the codeword in a manner different than the failed attempt.

6. The apparatus of claim 5, wherein the another attempt to decode the codeword includes a designation of bits of the first die as erasures.

7. The apparatus of claim 5, wherein the another attempt to decode the codeword includes a re-read of the codeword from a different demarcation than was used in the failed attempt.

8. The apparatus of claim 1, wherein the determination comprises use of an error detection code generated from the first portion of the codeword.

9. The apparatus of claim 8, wherein the error detection code is used to count sub-portions of the first portion of the codeword that include an error.

10. The apparatus of claim 9, wherein the error detection code comprises a plurality of parity bits.

11. The apparatus of claim 10, wherein the plurality of parity bits are calculated based on respective sub-portions of the first portion of the codeword.

12. The apparatus of claim 9, wherein the plurality of parity bits are XOR results of bits of the respective sub-portions of the first portion.

13. The apparatus of claim 1, wherein the respective error detection codes are stored on respective die.

14. A system comprising:
a storage drive comprising a plurality of die of non-volatile memory; and
a controller having a first block to encode data to be stored in the non-volatile memory as a codeword, to store respective portions of the codeword in a distributed manner across the plurality of die of the non-volatile memory, and to generate respective error detection codes for the plurality of die, and a second block coupled to the first block to identify a first die of the plurality of die for use in remedial action, based on a determination related to the error detection codes, that more sub-portions of a first portion of the codeword stored on the first die include an error than sub-portions of a second portion of the codeword stored on a second die of the plurality of die.

15. The system of claim 14, further comprising a touch screen display.

16. At least one non-transitory computer-readable memory comprising instructions that, responsive to execution of the instructions by a computing device, enable the computing device to operate:

a first block configured to encode data to be stored in a non-volatile memory as a codeword, to store respective portions of the codeword in a distributed manner across a plurality of die of the non-volatile memory, and to generate respective error detection codes for the plurality of die; and a second block configured to identify, responsive to a failed attempt by the first block to decode the codeword, a first die of the plurality of die for use in remedial action based on a determination related to the error detection codes that more sub-portions of a first portion of the codeword stored on the first die include an error than sub-portions of a second portion of the codeword stored on a second die of the plurality of die.

17. The at least one non-transitory computer-readable medium of claim 16, wherein the remedial action comprises an attempt to reconstruct a portion of the codeword read from the first die.

18. The at least one non-transitory computer-readable medium of claim 16, wherein the remedial action comprises another attempt to decode the codeword in a manner different than the failed attempt, including a designation of bits of the first die as erasures.

19. The at least one non-transitory computer-readable medium of claim 16, wherein the remedial action comprises another attempt to decode the codeword from a different demarcation than was used in the failed attempt.

20. The at least one non-transitory computer-readable medium of claim 16, wherein the error detection code is used to count sub-portions of the first portion of the codeword that include an error.

21. The at least one non-transitory computer-readable medium of claim 20, wherein the error detection code comprises a plurality of parity bits calculated based on respective sub-portions of the first portion of the codeword, and wherein the plurality of parity bits are XOR results of bits of the respective sub-portions of the first portion.

22. A computer-implemented method, comprising:
reading, by a controller from a plurality of die of non-volatile memory, respective portions of a codeword stored in a distributed manner across the plurality of die;
identifying, by the controller in response to a failed attempt to decode the codeword, a first die of the plurality of die, based on a determination related to respective error detection codes associated with the plurality of die, that more sub-portions of a first portion of the codeword stored on the first die include an error than sub-portions of a second portion of the codeword stored on a second die of the plurality of die; and
performing, by the controller, remedial action using the first die.

23. The computer-implemented method of claim 22, wherein performing the remedial action comprises attempting to reconstruct a portion of the codeword read from the first die, attempting to decode the codeword in a manner different than the failed attempt, or re-reading of the codeword from a different demarcation than was used in the failed attempt.

* * * * *